(12) United States Patent
Coudrain et al.

(10) Patent No.: US 8,486,817 B2
(45) Date of Patent: Jul. 16, 2013

(54) METHOD FOR FORMING AN INTEGRATED CIRCUIT LEVEL BY SEQUENTIAL TRIDIMENSIONAL INTEGRATION

(75) Inventors: Perceval Coudrain, Grenoble (FR); Philippe Coronel, Barraux (FR); Nicolas Buffet, Evian les Bains (FR)

(73) Assignees: STMicroelectronics S.A., Montrouge (FR); STMicroelectronics (Crolles 2) SAS, Crolles (FR); Commissariat à l'Énergies Atomique et aux Énergies Alternatives, Paris (FR)

( * ) Notice: Subject to any disclaimer, the term of this patent is extended or adjusted under 35 U.S.C. 154(b) by 238 days.

(21) Appl. No.: 12/794,092

(22) Filed: Jun. 4, 2010

(65) Prior Publication Data
US 2010/0308411 A1  Dec. 9, 2010

(30) Foreign Application Priority Data
Jun. 5, 2009 (FR) .................................. 09 53766

(51) Int. Cl.
*H01L 27/088* (2006.01)
*H01L 21/762* (2006.01)
*H01L 21/28* (2006.01)

(52) U.S. Cl.
USPC ........... 438/588; 438/149; 438/406; 438/587; 257/368

(58) Field of Classification Search
None
See application file for complete search history.

(56) References Cited

U.S. PATENT DOCUMENTS

| | | | |
|---|---|---|---|
| 5,466,631 A * | 11/1995 | Ichikawa et al. | 438/406 |
| 6,171,916 B1 * | 1/2001 | Sugawara et al. | 438/303 |
| 6,228,692 B1 * | 5/2001 | Tsutsu | 438/164 |
| 6,992,352 B2 * | 1/2006 | Lai et al. | 257/335 |
| 2002/0047169 A1 * | 4/2002 | Kunikiyo | 257/410 |
| 2008/0191312 A1 | 8/2008 | Oh et al. | |

FOREIGN PATENT DOCUMENTS

JP    03163825 A * 7/1991

OTHER PUBLICATIONS

Lim et al., "65nm High Performance SRAM Technology with 25F2 0.16 micron-squared S3 (Stacked Single-crystal Si) SRAM Cell, and Stacked Peripheral SSTFT for Ultra High Density and High Speed Applications", Proc. ESSDERC, Grenoble, France, 2005.*
French Search Report dated Nov. 2, 2009 from corresponding French Application No. 09/53766.

(Continued)

*Primary Examiner* — Johannes P Mondt
(74) *Attorney, Agent, or Firm* — Wolf, Greenfield & Sacks, P.C.

(57) ABSTRACT

A method for forming a level of a tridimensional structure on a first support in which components are formed, including the steps of forming, on a second semiconductor support, a single-crystal semiconductor substrate with an interposed thermal oxide layer; placing the free surface of the single-crystal semiconductor substrate on the upper surface of the first support; eliminating the second semiconductor support; and thinning down the thermal oxide layer down to a thickness capable of forming a gate insulator.

8 Claims, 2 Drawing Sheets

OTHER PUBLICATIONS

Batude P et al: 3D CMOS integration: Introduction of dynamic coupling and application to compact and robust 4T SRAM, Integrated Circuit Design and Technology and Tutorial, 2008. ICICDT 2008. IEEE International Conference on, IEEE, Piscataway, NJ, USA, Jun. 2, 2008, pp. 281-284, XP031287555.

Perceval Coudrain et al: *Setting Up 3D Sequential Integration for Back-Illuminated CMOS Image Sensors With Highly Miniaturized Pixels With Low Temperature Fully Depleted SOI Transistors*, IEEE International Electron Devices Meeting, IEDM 2008, Dec. 15-17, 2008, San Francisco, CO, USA, IEEE, Piscataway, NJ, USA, Dec. 15 2008, pp. 1-4, XP031434426.

Batude, P. et al., "Enabling 3D Monolithic Integration," ECS Transactions, vol. 16, No. 8, Oct. 12, 2008-Oct. 17, 2008, pp. 47-54, XP002553398.

* cited by examiner

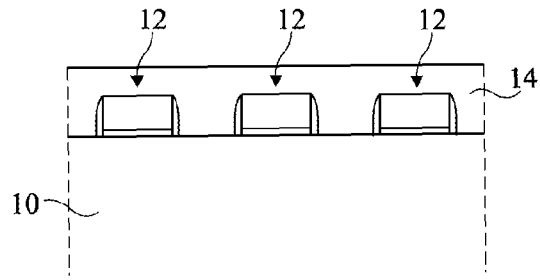
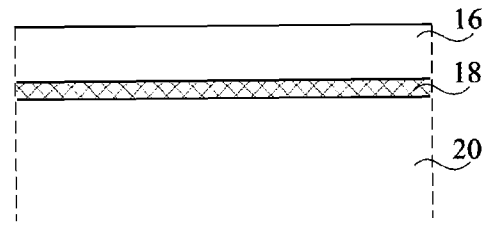
Fig 1A
PRIOR ART
Fig 1B
PRIOR ART
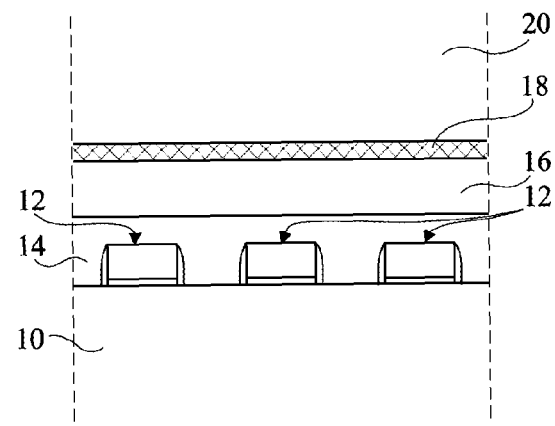
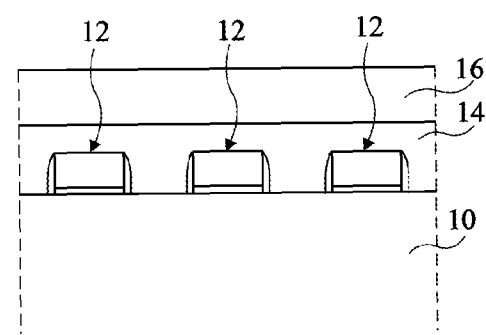
Fig 1C
PRIOR ART
Fig 1D
PRIOR ART
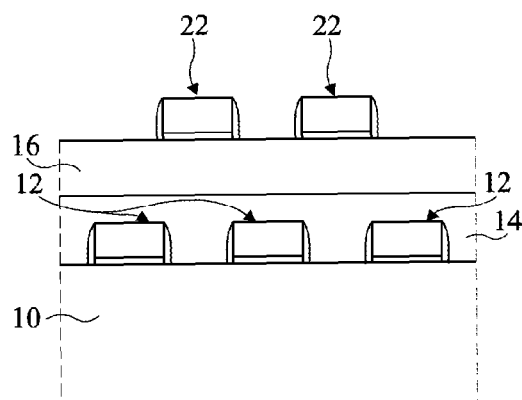
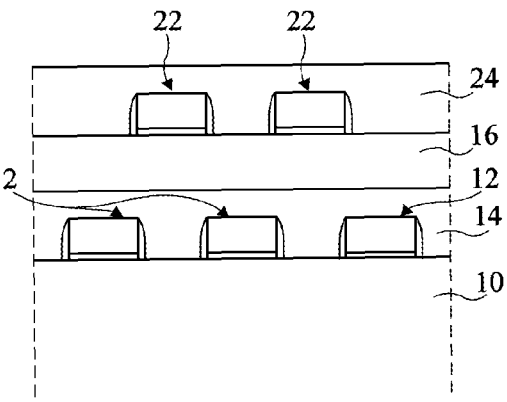
Fig 1E
PRIOR ART
Fig 1F
PRIOR ART

US 8,486,817 B2

METHOD FOR FORMING AN INTEGRATED CIRCUIT LEVEL BY SEQUENTIAL TRIDIMENSIONAL INTEGRATION

CROSS REFERENCE TO RELATED APPLICATIONS

This application claims the priority benefit of French patent application No. 09/53766, filed on Jun. 5, 2009, entitled "METHOD FOR FORMING AN INTEGRATED CIRCUIT LEVEL BY SEQUENTIAL TRIDIMENSIONAL INTEGRATION," which is hereby incorporated by reference to the maximum extent allowable by law.

BACKGROUND OF THE INVENTION

1. Field of the Invention

The present invention relates to a method for forming, by sequential tridimensional integration, a level of an integrated circuit on an existing level.

2. Discussion of the Related Art

Currently, in the field of integrated circuits, one of the known solutions to form increasingly compact systems is to perform a three-dimensional integration. Such an integration comprises forming several semiconductor substrates, on and inside of which are formed electronic components, above one another, and connecting components of different levels together, for example through substrates. This type of integration enables increasing the integration density and the number of integrated functionalities. This type of integration also reduces the length of interconnects between the different integrated circuit elements and decreases the power consumption.

So-called sequential integration methods are known, in which the tridimensional architecture is created one level after the other, in a vertical sequence. Components are formed inside and on top of a first substrate, after which a second substrate is either fixed above the first substrate, or formed by recrystallization of amorphous silicon or polysilicon. In this last case, it is difficult to obtain a strict single-crystal silicon substrate. Components are then formed inside and on top of the second substrate, and so on.

FIGS. 1A to 1F illustrate steps of a method for forming a level of a tridimensional integrated circuit by sequential integration. This method is especially described in the publication entitled "65 nm High Performance SRAM Technology with 25 $F^2$, 0.16 $\mu m^2$ $S^3$ (Stacked Single-crystal Si) SRAM Cell, and Stacked Peripheral SSTFT for Ultra High Density and High Speed Applications", by H. Lim et al., Proceedings of ESSDERC, 2005.

FIG. 1A illustrates a level of a tridimensional integrated circuit and FIG. 1B illustrates a structure based on which an upper level of the integrated circuit is formed, by sequential integration.

FIG. 1A shows a substrate 10 on top and inside of which electronic components are formed. In the shown examples, gates of transistors 12 are formed at the surface of substrate 10. Of course, other electronic components may be formed inside and on top of substrate 10. A dielectric material stack 14 in which interconnection elements (conductive tracks and vias) may be provided is formed on components 12. In the following description, stacks such as stack 14 will be called "interconnect stack", although the metal tracks and vias in such stacks are optional.

FIG. 1B shows a structure comprising a single-crystal silicon substrate 16 formed on an insulating layer 18, itself extending over a support 20, for example, a semiconductor support. The structure of FIG. 1B may be formed by any so-called SOI (silicon on insulator) method.

At the step illustrated in FIG. 1C, the free surface of silicon substrate 16 has been bonded, in any known fashion, for example, by molecular bonding, at the surface of interconnect stack 14 of the structure shown in FIG. 1A.

At the step illustrated in FIG. 1D, semiconductor support 20 and insulating layer 18 have been eliminated. A structure in which a second silicon substrate 16 extends on interconnect stack 14 is thus obtained.

At the step illustrated in FIG. 1E, electronic components, for example, insulated-gate transistors 22, are formed inside and on top of silicon substrate 16.

At the step illustrated in FIG. 1F, a second interconnect stack 24 is formed on electronic components 22. Stack 24 may comprise interconnection elements (conductive tracks and vias) and may be electrically connected to a metallization of stack 14 or directly connected to transistors 12 if no interconnection element is formed in stack 14. A structure is thus obtained, above which other substrates, and thus other levels of the tridimensional integrated circuit may be formed, by following the same procedure as for the forming of silicon substrate 16.

In this method, the components formed on top and inside of substrate 16 are formed during steps independent from the forming of substrate 16. Especially, the forming of a silicon oxide gate insulator for transistors 22 needs various types of chemical vapor depositions (for example, PECVD, for Plasma-Enhanced Chemical Vapor Deposition, HDP-CVD, for High-Density Plasma Chemical Vapor Deposition, ALD, for Atomic Layer Deposition, or again SACVD, for Sub-Atmospheric Chemical Vapor Deposition). Such methods generally do not enable to obtain layers having a thickness defined with an accuracy better than 5 nm. Further, for all these processes, a major disadvantage is the forming of an oxide exhibiting a medium-grade silicon interface, at least of lower grade than so-called "thermal" oxides formed by thermal oxidation of the silicon surface. This is due to the presence of traps in the oxide formed by deposition and of dangling bonds at the interface between the silicon and the oxide, which is not the case for oxide layers obtained by oxidation (thermal oxide).

Methods for forming thermal oxide layers require silicon heating steps at high temperature, generally on the order of 1000° C., which makes such methods incompatible with tridimensional device forming methods, electronic components being present in lower levels of the device. Indeed, too high temperatures destroy the characteristics of components such as transistors. Temperatures compatible with such components, typically lower than 700° C., do not provide sufficient oxidation kinetics.

Thus, there is a need for a method for manufacturing a tridimensional integrated circuit by sequential integration in which, in upper circuit levels, the gate oxides are of high grade.

SUMMARY OF THE INVENTION

An object of an embodiment of the present invention is to provide a method for manufacturing, by sequential integration, a level of a tridimensional structure, where insulated gates formed on this level are insulated by a thermal oxide.

Thus, an embodiment of the present invention provides a method for forming a level of a tridimensional structure on a first support in which components are formed, comprising the steps of:

forming, on a second semiconductor support, a single-crystal semiconductor substrate with an interposed thermal oxide layer;

placing the free surface of the single-crystal semiconductor substrate on the upper surface of the first support;

eliminating the second semiconductor support; and thinning down the thermal oxide layer down to a thickness capable of forming a gate insulator.

According to an embodiment of the present invention, the thermal oxide layer is thinned down by means of an ion beam based on atomic clusters.

According to an embodiment of the present invention, the thermal oxide layer is thinned down by means of an ion beam based on monomers.

According to an embodiment of the present invention, the free surface of the single-crystal silicon substrate is bonded to the first support by molecular bonding.

According to an embodiment of the present invention, the method further comprises the steps of forming, on the thinned-down thermal oxide layer, a conductive layer, and of etching the conductive layer and the thermal oxide layer to form insulated gates.

According to an embodiment of the present invention, the second support is eliminated by a combination of a chem.-mech. polishing and of a wet etch.

According to an embodiment of the present invention, the thermal oxide layer belongs to a dielectric multiple-layer stack such as an oxide-nitride-oxide stack.

According to an embodiment of the present invention, the single-crystal semiconductor substrate is made of silicon.

An embodiment of the present invention further provides a tridimensional integrated circuit comprising semiconductor substrates located above one another and separated by interconnect stacks, insulated gates being formed on at least some of the substrates, the insulating regions of the gates being made of a thermal oxide.

The foregoing objects, features, and advantages of the present invention will be discussed in detail in the following non-limiting description of specific embodiments in connection with the accompanying drawings.

BRIEF DESCRIPTION OF THE DRAWINGS

FIGS. 1A to 1F, previously described, illustrate a known method for forming a level of a tridimensional integrated circuit by sequential integration.

DETAILED DESCRIPTION

Figure 2A:
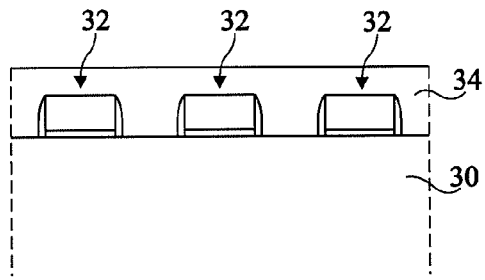
FIGS. 2A to 2F illustrate a method for forming a tridimensional integrated circuit according to an embodiment of the present invention.

For clarity, the same elements have been designated with the same reference numerals in the different drawings and, further, as usual in the representation of integrated circuits, the various drawings are not to scale.

To obtain, by sequential integration, a tridimensional integrated circuit comprising, on an upper level, insulated gates having an oxide obtained by a thermal oxidation reaction as a dielectric, the inventors provide a method that takes advantage of the present thermal oxide layer, above the upper level substrate, during the bonding thereof on an existing level.

Figure 2B:
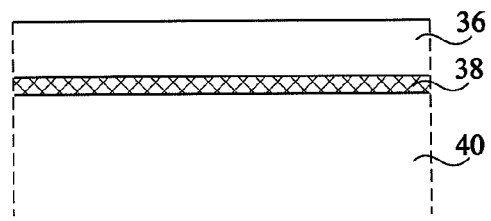

FIGS. 2A to 2F illustrate results of steps of such a method. FIG. 2A illustrates a support comprising electronic components forming a lower level of the integrated circuit and FIG. 2B illustrates a structure based on which an additional level of the integrated circuit is formed.

FIG. 2A shows a substrate 30 on which electronic components 32, for example, insulated-gate transistors are formed. An interconnect stack 34 in which conductive tracks and vias, separated by a dielectric material, may be formed, extends on components 32 to enable connections between components 32 and connections with upper level components. It should be noted that substrate 30 may itself form an upper level of a stack of levels of a tridimensional circuit.

FIG. 2B illustrates a structure comprising a silicon substrate 36 formed on an oxide layer 38, itself extending over a support 40. Oxide layer 38 is, conventionally, a thermal oxide layer, for example, made of silicon oxide, silicon oxynitride, or any other thermal oxide formed at high temperature.

The stack of FIG. 2B forms a current so-called SOI silicon-on-insulator structure. To obtain such a structure, a thermal oxide layer may for example be formed by high temperature oxidation (at a temperature above 1,000° C.) of the silicon at the surface of two independent silicon wafers. The two thermal oxide layers thus formed are then put in contact and the upper substrate (corresponding to silicon substrate 36) is then thinned down to obtain a substrate of desired thickness.

Figure 2C:
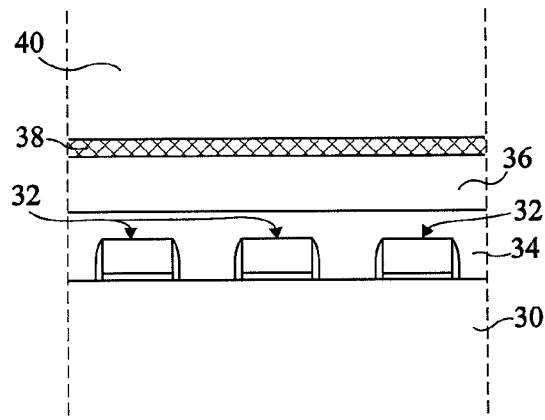

At the step illustrated in FIG. 2C, the free upper surface of silicon substrate 36 has been placed on interconnect stack 34. Silicon substrate 36 and interconnect stack 34 may be "bonded", for example, by molecular bonding (also called "direct bonding"). To achieve this, a polishing of the upper surface of interconnect stack 34 and of the upper surface of substrate 36 may be performed, as well as a chemical preparation of the surfaces to promote the bonding. After the two elements have been put in contact, low-energy bonds are created between the two surfaces by Van der Waals forces or hydrogen bridges. Such bonds are then transformed into higher-energy bonds, enabling a permanent bonding, by a consolidation anneal, the temperature of which partly conditions the final bonding energy. To avoid altering electronic components 32 formed inside and on top of substrate 30 (and in lower levels, if present), the heating is performed at a temperature typically lower than 600° C. Advantageously, such a heating enables obtaining a significant bonding energy (typically greater than 900 mJ/m$^2$) between layers 34 and 36.

Figure 2D:
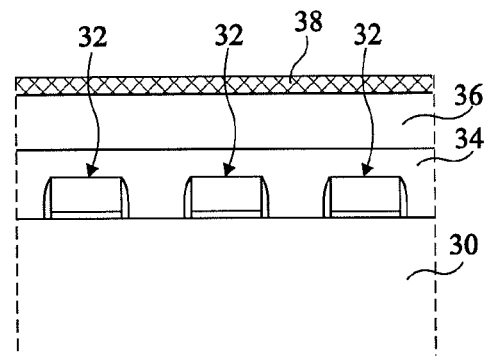

At the step illustrated in FIG. 2D, semiconductor support 40 has been eliminated. As an example, support 40 may be eliminated by combination of a wet etch and of a chem.-mech. polishing, the etch stop occurring on thermal oxide layer 38 due to a method for selectively etching the semiconductor over silicon oxide.

Figure 2E:
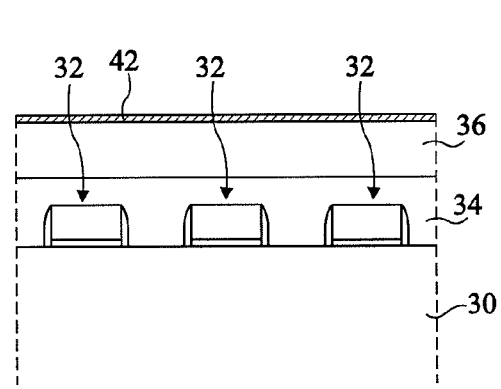

At the step illustrated in FIG. 2E, thermal oxide layer 38, which has an initial thickness greater than 20 nm (generally on the order of 150 nm), has been thinned down to form a thermal oxide layer 42 having a thickness ranging between 3 and 15 nm, capable of forming a gate dielectric layer.

Current chemical etch and plasma etch methods are not accurate enough yet to thin down layer 38. Thus, to perform this thinning, the inventors provide etching oxide layer 38 by means of an ion beam. This etching may be performed by means of an ion beam based on atomic clusters (several thousands of atoms for from one to two charges) or by means of a monomer-based ion beam (one charge per atom).

For this purpose, an initial mapping of the surface of thermal oxide layer 38 is performed, after which this surface is locally bombarded. More or less matter is then eliminated according to the time during which the beam remains in front of each point of the surface of layer 38. Advantageously, etchings by ion beams based on atomic clusters provide an excellent control of the thickness of the abraded layer, thus enabling to obtain a thermal oxide layer 42 having a thickness on the order of 6 nm, with a thickness variation below one nanometer. Of course, any method capable of performing such a thinning may be used.

It should be noted that a second step of mapping of the surface of the thermal oxide layer may be carried out in an intermediary step, to adjust the oxide thickness to be eliminated at each point of oxide layer 38.

Figure 2F:
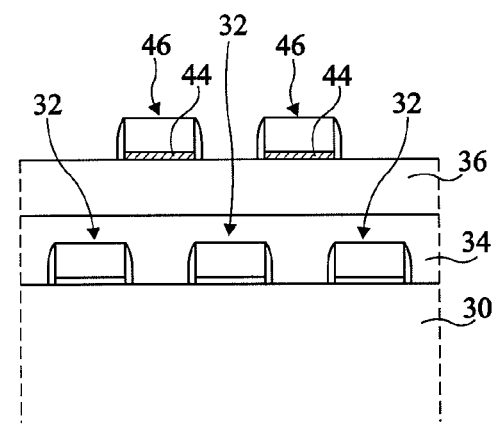

At the step illustrated in FIG. 2F, thermal oxide layer 42 has been etched, at desired locations, to form portions 44 forming the gate dielectrics of gates of insulated transistor 46 formed on substrate 36. To form the gates of transistors 46, a full-plate layer of polysilicon or of a conductive material capable of forming the gate conductor may be formed on the structure of FIG. 2E, after which the conductive material layer and oxide layer 42 may be etched by means of a single mask.

The transistors 46 thus formed have the advantage of exhibiting a thermal oxide gate dielectric region, having a next-to-perfect interface with the single-crystal silicon of substrate 36. Thus, the dispersion between the different electronic components is significantly decreased, a high mobility of the carriers in the transistor channel region and a decreased low-frequency noise level are preserved due to a lower density of defects at the interface (or close to the interface) between the oxide and the silicon. It should be noted that thermal oxide layer 42 may also be used to form any component requiring an insulating layer at the surface of substrate 36, for example, memories.

It should be understood that the steps of FIGS. 2A to 2F may be repeated several times to form tridimensional integrated circuits comprising more than two levels.

Specific embodiments of the present invention have been described. Various alterations and modifications will occur to those skilled in the art. It should in particular be noted that thermal oxide layer 42 may be made of any insulating material to be manufactured at high temperatures.

Further, in the foregoing description, the use of a thermal oxide formed in an SOI structure to form gate insulators of a level of a tridimensional circuit has been discussed. It should be noted that an SOI-type structure may also be formed, in which the intermediary dielectric material layer is formed of a stack of dielectric materials formed by thermal processes, for example a thermal oxide-nitride-oxide stack. In this case, the stack may be provided to form gate insulators in levels of a tridimensional circuit, for example, for memory components.

Moreover, the present description has been made in the case where substrate 36 is a silicon substrate and where thermal oxide layer 38 is made of silicon oxide. It should be noted that substrate 36 may also be made of any single-crystal semiconductor material, for example, silicon-germanium or germanium, on which a thermal oxide is capable of being formed.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method for forming a level of insulated gate of a tridimensional structure on a first support in which components are formed, comprising the steps of:
    forming, on a semiconductor support, a single-crystal semiconductor substrate with an interposed thermal oxide layer;
    placing a free surface of the single-crystal semiconductor substrate on an upper surface of the first support;
    eliminating the semiconductor support; and
    thinning down the thermal oxide layer down to a thickness between 3 and 15 nm;
    forming, on the thinned down thermal oxide layer, a conductive layer; and
    etching the conductive layer and the thermal oxide layer to form insulated gates.

2. The method of claim 1, wherein the thermal oxide layer is thinned down by means of an ion beam based on atomic clusters.

3. The method of claim 1, wherein the thermal oxide layer is thinned down by means of an ion beam based on monomers.

4. The method of claim 1, wherein the free surface of the single-crystal semiconductor substrate is bonded to the first support by molecular bonding.

5. The method of claim 1, wherein the semiconductor support is eliminated by a combination of a chemical-mechanical polishing and of a wet etch.

6. The method of claim 1, wherein the thermal oxide layer belongs to a dielectric multiple-layer stack.

7. The method of claim 1, wherein the single-crystal semiconductor substrate is made of silicon.

8. The method of claim 6, wherein the dielectric multiple-layer stack comprises an oxide-nitride-oxide stack.

* * * * *